United States Patent [19]

Sebald et al.

[11] Patent Number: 5,250,375
[45] Date of Patent: Oct. 5, 1993

[54] PHOTOSTRUCTURING PROCESS

[75] Inventors: Michael Sebald, Hessdorf-Hannberg; Juergen Beck; Rainer Leuschner, both of Erlangen; Recai Sezi, Roettenbach; Siegfried Birkle, Hoechstadt A/Aisch; Hellmut Ahne, Roettenbach; Eberhard Kuehn, Hemhofen, all of Fed. Rep. of Germany

[73] Assignee: Siemens Aktiengesellschaft, Munich, Fed. Rep. of Germany

[21] Appl. No.: 812,585

[22] Filed: Dec. 20, 1991

[30] Foreign Application Priority Data

Dec. 20, 1990 [DE] Fed. Rep. of Germany ....... 4040998

[51] Int. Cl.$^5$ .................... G03C 5/58; G03F 7/039
[52] U.S. Cl. ........................................ 430/8; 430/313; 430/323; 430/325; 430/326; 430/330
[58] Field of Search ............... 430/325, 326, 323, 330, 430/8, 313

[56] References Cited

U.S. PATENT DOCUMENTS

| 4,491,628 | 1/1985 | Ito et al. | 430/176 |
| 4,837,124 | 6/1989 | Wu et al. | 430/270 |
| 4,912,018 | 3/1990 | Osuch et al. | 430/270 |

FOREIGN PATENT DOCUMENTS

| 0388484 | 3/1989 | European Pat. Off. |
| 0395917 | 4/1990 | European Pat. Off. |
| 394740 | 10/1990 | European Pat. Off. |

Primary Examiner—Christopher D. Rodee
Attorney, Agent, or Firm—Kenyon & Kenyon

[57] ABSTRACT

A process for producing structures in the submicron range is characterized by the following steps:

a photoresist layer comprising a polymer constituent with functional groups, which are capable of reacting with primary or secondary amines, and N-blocked imide groups, a photoinitiator which releases an acid when irradiated and a suitable solvent is deposited on to a substrate;

the photoresist layer is dried;

the photoresist layer is exposed in an imagewise manner;

the exposed photoresist layer is subjected to a temperature treatment;

the photoresist layer treated in this manner is developed with an aqueous-alkaline or organic developing agent into a photoresist structure; and the photoresist structure is treated with a chemical agent containing a primary or secondary amine; a defined dark field loss, is adjusted thereby during development in the range of between 20 and 100 nm.

14 Claims, No Drawings

PHOTOSTRUCTURING PROCESS

BACKGROUND OF THE INVENTION

1. Field of the Invention

The invention relates to a process for producing structures in the submicron range.

2. Description of Related Art

European Published Patent Application 0 388 484 discloses an aqueous-alkaline developable, highly resolving photoresist for producing structures in the submicron range. This resist consists of a developable base polymer and of a photoactive constituent (as well as possibly other customary additives), whereby the base polymer, as developable—and thus solutizing—groups, exhibits anhydride functions. The anhydride-containing base polymers, which are DUV-transparent and which are suited both for the single-layer and the two layer technique, preferably contain 10 to 55 mol % maleic anhydride and are obtained through co- or ter-polymerization with allyl trimethylsilane and styrol, as well as possible with another monomer, for example maleinimide.

When exposed to DUV, for example at a wavelength of 248 nm, photoresists with these types of base polymers, which as photoactive constituents contain diazo naphthoquinone derivatives or diazoketone derivatives, require a dose of about 70 to 80 $mJ/cm^2$ for a zero bias exposure. This relatively high dose can be disadvantageous, because at a low throughput rate in production lines, for example, for highly integrated microelectronic components, the cost-intensive exposure units (steppers) have to be occupied for a long time; therefore, generally a sensitivity of $<20$ $mJ/cm^2$ is required for production. When silicon-containing resists of this type are applied using the two-layer technique, a problem also arises that after the structure transfer in the oxygen plasma, submicron structures are obtained in the bottom resist, which compared to the structures in the top resist have lost more than 10% of their line width. However, this cannot be tolerated in the production.

European Published Patent Application 0 395 917 discloses a photostructuring process, which allows submicron structures to be transferred photolithographically using the two-layer technique. In this process, the advantages of anhydride-containing base polymers or resists are utilized and, at the same time, a pattern transfer true to size is rendered possible. This means that the exact mask dimensions are reproduced in the bottom resist using the two-layer technique. This is accomplished by chemically expanding the anhydride-containing structures in the top resist to an extent that corresponds exactly to the loss in dimensions which occurs during the structure transfer in the oxygen plasma. In this process as well, a relatively high dose is needed to structure the top resist, namely about 90 $mJ/cm^2$ (in the DUV range).

Furthermore, for the first time, the mentioned photostructuring process made it feasible to produce structure dimensions smaller than those stipulated by the physical resolution limit of the applied lithographic technique. This means that the width of the spaces in the photoresist structure is reduced in size to below the resolution limit. This is achieved by chemically expanding the anhydride-containing resist structures by a measure of a few nanometers up to a few micrometers, by which means the spaces are narrowed correspondingly. In this procedure, which is feasible both for the single-layer as well as for the two-layer technique, resists with diazoketone derivatives are applied as photoactive components. However, these resists do not satisfy production demands with respect to sensitivity.

U.S. Pat. No. 4,491,628 discloses a positive- or negative-working resist composition. Here, the problem of the inadequate sensitivity of conventional resists is approached with the concept of so-called chemical amplification. To this end, the resist composition contains a polymer with acid-labile residues and a photoinitiator, which releases an acid when irradiated. Base polymers are used which possess alkali-soluble groups, for example phenolic OH-groups (in a vinylphenol polymer), which are blocked by acid-cleavable groups, for example a tertiary butyl or a tertiary butoxycarbonyl group. Thus, the polymer is initially alkali-insoluble. As a photoinitiator (or photoacid), which forms a strong acid when irradiated with DUV light, or with electron or X-ray beams, so-called Crivello salts are used, that is onium salts, such as triphenylsulphonium-hexafluorophosphate.

The high sensitivity of resist compositions of the above mentioned type can be explained by the fact that during a temperature treatment following the exposure ("post exposure bake"), a single proton produced from the photoacid during exposure, and in fact by means of a photon, catalytically cleaves off multiple acid-cleavable groups, that is it releases a number of alkali-soluble groups. On the other hand, in the case of conventional resists containing diazo compounds (as a photoactive constituent), a maximum of only one single alkali-soluble acid grouping can be produced per photon. A sensitivity is specified for the resist compositions which ranges in the case of UV irradiation from 5 to 55 $mJ/cm^2$ or, in the case of electron-beam irradiation, lies at 10 $\mu C/cm^2$. Moreover, they exhibit a high contrast. The disadvantage of these systems, however, is that a structure transfer true to size is not possible, and narrow spaces, that is spaces with a width smaller than the resolution limit, cannot be produced. In addition, either the DUV transparency or the etch resistance to substrate etching processes is relatively low.

From U.S. Pat. Nos. 4,837,124 and 4,912,018, a photoresist composition is known for DUV and excimer-laser lithography, which likewise works according to the chemical amplification concept. For that, the resist composition has 1 to 50% of a latent photoacid and 50 to 99% of a film-forming, imide-group containing polymer, dissolved together in a solvent. To make the polymer alkali-insoluble, an adequate quantity of the imide groups is blocked with acid-labile groups; such groups are oxycarbonyl groups, in particular the tertiary butoxycarbonyl group. The acid-labile groups are cleaved off in the described manner by means of the photoacid. As a result, the polymer—because of the developing imide groups—becomes alkali-soluble. The advantage of this resist composition is an improved resolution capacity, however, it has the same disadvantages as the resist composition according to U.S. Pat. No. 4,491,628. Moreover, it is disadvantageous that the introduction of the acid-labile groups by means of a polymer analogous reaction is not controllable and does not proceed with reproducibility and, consequently, also does not follow quantitatively.

SUMMARY OF THE INVENTION

The object of the invention is to specify a process which permits a structure transfer true to size using the two-layer technique and which permits structures spaces or holes) to be produced beyond the resolution limit, whereby a high transparency, a high resolution, even in the sub-half-micron range, and a high sensitivity ($<20$ mJ/cm$^2$ in the DUV range) results both for UV light, as well as for electron and X-ray beams.

In accordance with the invention this is achieved as follows:

a) a photoresist layer comprising a polymer constituent having
   functional groups, which are capable of reacting with primary or secondary amines, and
   N-blocked imide groups, a photoinitiator which releases an acid when irradiated and a suitable solvent is deposited on to a substrate;
b) the photoresist layer is dried;
c) the photoresist layer is exposed in an imagewise manner;
d) the exposed photoresist layer is subjected to a temperature treatment;
e) the photoresist layer treated in this manner is developed with an aqueous-alkaline or organic developing agent into a photoresist structure; and
f) to expand the resist lines and to produce etching resistance, the photoresist structure is treated with a chemical agent containing a primary or secondary amine, where, during development, a defined dark field loss is adjusted in the range of between 20 and 100 nm.

DETAILED DESCRIPTION OF THE INVENTION

In the process according to the invention, it is important for the photoresist to be applied with a polymer component having two different types of functional groups. On the one hand, these are groups which react with primary and secondary amines and, on the other hand, N-blocked imide groups. In the latter case, these are NH-groups (of acid imides), in which the hydrogen atom has been replaced by an acid-cleavable protective group. The two functional groups can thereby be present in different polymers, however, they advantageously exist in one and the same polymer.

Also important to the process according to the invention is that a defined dark field loss takes place during development. This dark field loss is in the range of between 20 and 100 nm; preferably the dark field loss amounts to about 50 nm.

There are three possible ways to adjust the dark field loss. They can be applied individually or collectively:

The temperature/time combination when the photoresist is dried (process step b);

the temperature/time combination during the temperature treatment of the photoresist (process step d);

the temperature and duration of the development, as well as the type and possibly the concentration of the developing agent (process step e).

In the two first-mentioned possibilities, the temperature/time combination when the resist is heated, for example on a hot plate, is selected so that the desired dark field loss is adjusted during the wet development. In both cases, that is when the resist is dried ("prebake") and during the temperature treatment ("post exposure bake"), the heating is preferably carried out in the temperature range of between 60° and 160° C., preferably in a time period of between 10 and 150 s. In this way, a thermal cleavage of protective groups takes place. The wet development generally takes place at a temperature of 5° to 50° C., and in fact for a duration of 15 to 300 s. The concentration of the aqueous-alkaline developing agent, for example of a tetramethylammoniumhydroxide-containing developing agent, is thereby 0.05 to 1 molar.

The process according to the invention can proceed in the above described manner according to the single-layer resist technique. The applied photoresist, which is transparent to the exposure wavelength, must not necessarily be resistant to substrate etching processes. This process can, however, work advantageously according to the two-layer resist technique. For that, a layer of resist that is resistant to substrate etching processes is initially applied to the substrate. This resist, the so-called bottom resist, therefore exhibits aromatic structures; usually a novolak serves for this purpose. The bottom resist in subsequently baked out; in this case a cross-linking (of the novolak) follows, through which means the resist becomes insoluble for top-resist solvents.

According to the process of the invention, a photo resist is then applied as a top resist to the bottom resist. This photoresist must not necessarily be etch-resistant to a dry development in the oxygen plasma. The top resist is dried, irradiated, subjected to a temperature treatment, wet developed and chemically aftertreated in the described manner. The photoresist structure that remains after the chemical aftertreatment is then still etched in an anisotropic, oxygen-containing plasma, through which means a structure transfer to the bottom resist takes place.

According to the process of the invention, during the imagewise exposure (step c), an acid is produced from the photoinitiator in the exposed regions. As a result of the temperature treatment ("post exposure bake") following the exposure, an acid-catalyzed cleavage of the protective groups then takes place. The initially alkali-insoluble polymer thereby becomes alkali-soluble, that is the resist becomes developable in the exposed regions. As a result of the chemical aftertreatment following the alkaline development, the (top) resist lines are expanded, that is the (top) resist spaces or holes are narrowed. When the single-layer technique is used, an etch resistance to substrate etching processes is produced at the same time—by applying an aromatic group-containing agent. In the case of the two layer technique, an etch resistance to dry development in the oxygen plasma is produced by applying a silicon-containing agent.

The functional groups of the polymer component which can react with primary and secondary amines, are preferably carboxylic acid anhydride groups; in addition, epoxide groups and ester groups are also considered. Preferably, maleic anhydride is the basis of the anhydride groups, optionally in substituted form; another compound of this type is, for example, itaconic acid anhydride (itaconic acid=methylene-succinic acid). The polymers can exhibit both cyclical anhydride functions, which can be arranged either in the main chain or in the side chain, as well as non-cyclical, that is linear anhydride functions. A series of corresponding monomers are known from the European Published Patent Application 0 388 484, for example acrylic- or methylacrylic-acid anhydride and vinylphthalic anhydride.

The imide groups of the polymer constituent are preferably blocked by a tertiary butoxycarbonyl residue, that is —CO—O—C(CH$_3$)$_3$(Boc residue), and/or by a tertiary butyl residue. These residues, which serve as a type of protective group, are acid-labile, that is they are cleaved off by acids. The basis of the imide groups is preferably maleinimide, optionally in substituted form. Another possible imide group can exist in the polymer, for example in the form of glutarimide units. A process for producing Boc-blocked maleinimide is the subject matter of the German Patent Application No. P 40 40 999.6 entitled "N-tert.-butoxycarbonyl-maleinimide".

To produce the polymer constituent, compounds as known from the European Published Patent Application 0 388 484 can be used as comonomers for a polymerization with N-tertiary butoxycarbonyl- or N-tertiary butyl-maleinimide. Preferably the polymerization is radically initiated. The polymers are distinguished by a high transparency, both in the near as well as in the deep ultraviolet range and are therefore well suited for application in high-contrast DUV photoresists. For example for exposures with KrF excimer laser exposure units (at a wavelength of 248 nm).

N-tertiary butoxycarbonyl- or N-tertiary butyl-maleinimide/maleic anhydride copolymers can advantageously find application in the process according to the invention. Preferably, however, copolymers from N-tertiary butoxycarbonyl- or N-tertiary butyl-maleinimide, maleic anhydride and styrol and/ or allyl trimethylsilane are applied. Polymers containing N-tertiary butyl-maleinimide, which can be applied in the process according to the invention, are the subject matter of the German Patent Application No. P 40 40 996.1 entitled "Maleinimide Polymer". The polymers can be built up both as bipolymers and as terpolymers.

Generally known compounds (cf. for example European Published Patent Application 0 102 450 and 0 234 327) can be used in the process according to the invention as photoinitiators, which in the present case can also be described as photoacids. The sole requisite property that is important for selecting the photoinitiator is that of releasing an acid during exposure. The irradiation takes place with UV-light or with electron or X-ray beams, whereby a strong acid is advantageously formed. The acid then causes the tertiary butoxycarbonyl- or tertiary butyl residue to cleave off from the blocked imide groups, during a temperature treatment following the exposure. As a result of this acid-catalyzed deblocking, the initially hydrophobic, alkali-insoluble polymer becomes hydrophilic and alkali-soluble.

For the process according to the invention, the photoinitiator is preferably an onium salt. These types of compounds, which are also described as Crivello salts, are for example diphenyliodonium- and triphenylsulphonium-triflate (triflate denotes the trifluoromethanesulphonyl residue). Other applicable photoinitiators are, for example, triazine derivatives. The photoinitiator is generally applied in a concentration of 1 to 20% by weight, relative to the dry photoresist, that is to the solvent-free resist composition.

Generally known resist solvents are used as solvents. The sole requirement that is important for selecting the solvent is that both the polymer constituent as well as the photoinitiator must be dissolved. Moreover—with the known coating processes—faultless resist layers must be formed on the substrates, for example on silicon wafers or on wafers coated with a bottom resist. The solvent is preferably cyclohexanone or methoxypropylacetate. In addition diethyleneglycol-dimethylether can also be used, for example.

The photoresist applied in the process according to the invention exhibits a sensitivity of 1 to 5 mJ/cm$^2$. Besides the mentioned constituents, this photoresist can also contain other additives. Such additives are, for example, sensitizers, which enable the resist to be sensitized for exposures in the near UV-range, for example at 365 nm. A particularly suitable sensitizer is perylene.

According to the process of the invention, both positive as well as negative structures can be produced. This depends in fact on whether a developing agent is used during the wet development which dissolves out the exposed, that is the hydrophilic and alkali-soluble regions (of the photoresist layer exposed in an imagewise manner), or a developing agent which dissolves out the unexposed, that is the hydrophobic, alkali-insoluble regions. In the first case, this is an aqueous-alkaline developing agent and, in the second case, an organic developing agent, that is a liquid, organic medium, particularly in the form of a relatively high-boiling organic solvent, such as anisole, toluol and xylol. Furthermore, the process according to the invention can be applied both for the single-layer resist technique (with wet development) and also for the two-layer resist technique (with wet and dry development).

For the single-layer technique, preferred polymers contain aromatic groups in addition to tertiary butoxycarbonyl groups or tertiary butyl groups and carboxylic acid anhydride groups. These types of polymers can be obtained—in a simple manner—for example through the radical polymerization of maleic anhydride and N-tertiary butoxycarbonyl- or N-tertiary butyl-maleinimide with an aromatic monomer, such as styrol, and possibly with one or more other monomers, such as allyl trimethylsilane. However, other aromatic monomers can be applied, as known for example from the European Published Patent Application 0 388 484. As a result of the mixture ratio of the monomers both the molar portion of tertiary butoxycarbonyl- or tertiary butyl-maleinimide, as well as that of the other monomers are able to be easily and reproducibly controlled in the polymer. For an application with the single-layer technique, terpolymers of 10 to 55 mole % tertiary butoxycarbonyl- or tertiary butyl-maleinimide, 10 to 55 mole % maleic anhydride and 10 to 55 mole % styrol are preferred; the individual constituents complement one another in each case to 100%.

For the two-layer technique, preferred polymers contain silicon-containing groups in addition to tertiary butoxycarbonyl groups or tertiary butyl groups and carboxylic acid anhydride groups. These types of polymers can be obtained—in a simple manner—for example, through the radical polymerization of maleic anhydride and N-tertiary butoxycarbonyl- or N-tertiary butyl-maleinimide with an silicon-containing monomer, such as allyl trimethylsilane, and possibly with one or more other monomers, such as styrol. However, other silicon-containing monomers can be applied, as known for example from the European Published Patent Application 0 388 484. As a result of the mixture ratio of the monomers, both the molar portion of tertiary butoxycarbonyl- or tertiary butyl-maleinimide, as well as that of the other monomers are able to be easily and reproducibly controlled in the polymer. For a two-layer application, terpolymers of 10 to 55 mole % tertiary butoxycarbonyl- or tertiary butyl-maleinimide, 10 to 55 mole % maleic anhydride and 10 to 55 mole % allyl trimethylsilane are preferred. The individual constituents complement one another in each case to 100%.

The process according to the invention can be applied particularly advantageously in the manner as known from the European Published Patent Application 0 395 917, that is it can be used to vary the width of photoresist structures. This takes place first during the structure transfer true to size using the two-layer technique and second when structures are produced beyond the resolution limit. In both procedures, it is important for the selection of the resist polymer, that the polymer exhibits an hydride-containing groups or other groups, which react spontaneously with primary or secondary amines, particularly in the form of aminosiloxanes.

The invention shall be clarified in still greater detail with reference to the following examples.

EXAMPLE 1

Producing ter(N-tertiary butoxycarbonyl-maleinimide/maleic anhydride/styrol)

A solution of 5.42 g N-tertiary butoxycarbonyl-maleinimide (27.5 mmole), 2.7 g maleic anhydride (27.5 mmol), 5.2 g styrol (50 mmole) and 0.17 g azoisobutyric acid nitrile (1.04 mmole) in 50 ml diethylketone is heated until boiling for 1 h under a protective gas atmosphere. After cooling to room temperature, the terpolymer which results is separated out by adding the reaction mixture by drops into 350 ml petroleum benzine. After being filter and dried in a vacuum, 11.8 g of colorless, aromatic polymer are obtained; the monomer proportion of about 1:1:2 in the terpolymer is confirmed $^1$H-NMR spectroscopically.

EXAMPLE 2

Producing ter(n-tertiary butyl-maleinimide/maleic anhydride/styrol)

A solution of 4.21 g N-tertiary butyl-maleinimide (27.5 mmol), 2.7 g maleic anhydride (27.5 mmole), 5.2 g styrol (50 mmole) and 0.17 g azoisobutyric acid nitrile (1.04 mmole ) in 50 ml diethylketone is heated until boiling for 1 h under a protective gas atmosphere. After cooling to room temperature, the terpolymer that results is separated out by adding the reaction mixture by drops into 350 ml petroleum benzine. After being filtered and dried in a vacuum, 11.5 g of colorless, aromatic polymer are obtained; the monomer proportion of about 1:1:2 in the terpolymer is confirmed $^1$H-NMR spectroscopically.

EXAMPLE 3

Producing ter(N-tertiary butoxycarbonyl-maleinimide/maleic anhydride/allyl trimethylsilane)

A solution of 4.34 g N-tertiary butoxycarbonyl-maleinimide (22 mmole), 3.24 g maleic anhydride (33 mmole), 5.71 g allyl trimethylsilane (50 mmole) and 0.17 g azoisobutyric acid nitrile (1.04 mmole) in 50 ml diethylketone is heated until boiling for 1 h under a protective gas atmosphere. After cooling to room temperature, the terpolymer that results is separated out by adding the reaction mixture by drops into 350 ml petroleum benzine. After being filtered and dried in a vacuum, 10.2 g of colorless, silicon-containing polymer are obtained; the monomer proportion of about 2:3:4.5 in the terpolymer is confirmed $^1$H-NMR spectroscopically.

EXAMPLE 4

Producing ter(N-tertiary butyl-maleinimide/maleic anhydride/allyl trimethylsilane A solution of 3.37 g N-tertiary butyl-maleinimide (22 mmol), 3.24 g maleic anhydride (33 mmole), 5.71 g allyl trimethylsilane (50 mmole) and 0.17 g azoisobutyric acid nitrile (1.04 mmole) in 50 ml diethylketone is heated until boiling for 1 h under a protective gas atmosphere. After cooling to room temperature, the terpolymer that results is separated out by adding the reaction mixture by drops into 350 ml petroleum benzine. After being filtered and dried in a vacuum, 11.7 g of colorless, silicon-containing polymer are obtained; the monomer proportion of about 2:3:4.5 in the terpolymer is confirmed $^1$H-NMR spectroscopically.

EXAMPLE 5

Producing quater(n-tertiary butoxycarbonyl-maleinimide/maleic anhydride/allyl trimethylsilane/-styrol)

A solution of 4.34 g N-tertiary butoxycarbonyl-maleinimide (22 mmole), 3.24 g maleic anhydride (33 mmole), 2.86 g allyl trimethylsilane (25 mmole), 2.61 g styrol (25 mmole) and 0.17 g azoisobutyric acid nitrile (1.04 mmole) in 50 ml diethylketone is heated until boiling for 1 h under a protective gas atmosphere. After cooling to room temperature, the quaterpolymer that results thereby is separated out by adding the reaction mixture by drops into 350 ml petroleum benzine. After being filtered and dried in a vacuum, 10.8 g of colorless, aromatic, silicon-containing polymer are obtained; the monomer proportion of about 2:3:2:2 in the quaterpolymer is confirmed $^1$H-NMR spectroscopically.

EXAMPLE 6

A photoresist with ter(N-tertiary butoxycarbonyl-maleinimide/maleic anhydride/styrol) and diphenyliodoniumtriflate 4.5 g of the terpolymer produced according to Example 1 are dissolved at room temperature together with 0.5 g of diphenyliodonium-triflate in 40 ml cyclohexanone. The solution is then centrifuged at 1800 rpm onto a 4" silicon wafer and dried for 1 min at 80° C. on a hot plate. A resist layer with a thickness of 1 μm is obtained.

EXAMPLE 7

A photoresist with ter(n-tertiary butyl-maleinimide/-maleic anhydride/styrol) and diphenyliodonium-triflate 4.5 g of the terpolymer produced according to Example 2 are dissolved at room temperature together with 0.5 g of diphenyliodonium-triflate in 40 ml cyclohexanone. The solution is then centrifuged at 2000 rpm on to a 4" silicon wafer and dried for 1 min at 80° C. on a hot plate. A resist layer with a thickness of 1 μm is obtained.

EXAMPLE 8

A photoresist with ter(N-tertiary butyl-maleinimide/-maleic anhydride/allyl trimethylsilane) and diphenyliodonium-triflate 4.5 g of the terpolymer produced according to Example 4 are dissolved at room temperature together with 0.5 g of diphenyliodonium-triflate in 40 ml cyclohexanone. The solution is then centrifuged at 3500 rpm on to a 4" silicon wafer, which had previously been provided with a 1.3 μm thick bottom-resist layer (novolak resist baked out at 230° C.), and dried for 1 min at 80° C. on a hot plate. A resist layer with a thickness of 0.32 μm is obtained.

If it is dried for 1 min at 140° C., then a resist layer with a thickness of 0.3 μm is obtained.

EXAMPLE 9

A photoresist with quater(N-tertiary butoxycarbonyl-maleinimide/maleic anhydride/allyl trimethylsilane/styrol) and diphenyliodonium-triflate 4.5 g of the quaterpolymer produced according to Example 5 are dissolved at room temperature together with 0.5 g of diphenyliodonium-triflate in 40 ml cyclohexanone. The solution is then centrifuged at 4000 rpm on to a 4" silicon wafer, which had previously been provided with a 1.3 μm thick bottom-resist layer (novolak resist baked out at 230° C.), and dried for 1 min at 80° C. on a hot plate. A resist layer with a thickness of 0.32 μm is obtained.

If it is dried for 1 min at 140° C., then a resist layer with a thickness of 0.3 μm is obtained.

EXAMPLE 10

Measuring the DUV photosensitivity and the contrast

A single-layer resist layer produced according to Example 6 is contact-printed at 248 nm through a multidensity mask (firm Ditric Optics-Wilm. Div.). After the exposure, the wafer is placed on a 110° C.-hot hot plate for 1 min and subsequently developed for 120 s in the commercial developing agent NMD-W 2.38 % (firm Tokyo Ohka). The developed wafer is then rinsed under running water and dried at 100° C. for 1 min on a hot plate. The contact-printed wafer shows a sensitivity of 1.9 mJ/cm$^2$ and a very high contrast of $-\gamma > 6$. The finest structures on the mask, 1 μm lines and -spaces, are exactly resolved. A dark field loss is not established.

A contact-printed wafer that has been thermally treated at 120° C. having a single-layer resist layer produced according to Example 7 exhibits a sensitivity of 1.3 mJ/cm$^2$ and a very high contrast of $-\gamma > 5$. The finest structures on the mask are exactly resolved in this case as well; there is no dark field loss.

EXAMPLE 11

DUV Photostructuring

A single-layer resist layer produced according to Example 6 is exposed in an imagewise manner on a KrF-excimer-laser projection printer (exposure wavelength: 248 nm; numerical aperture: 0.37; resolution: 0.35 μm) with a dose of 18 mJ/cm$^2$. After the exposure, the wafer is placed on a 110° C.-hot hot plate for 1 min and subsequently developed for 120 s in the commercial developing agent NMD-W 2.38% (firm Tokyo Ohka). The developed wafer is then rinsed under running water and dried at 100° C. for 1 min on a hot plate. Structures with steep slopes can be well resolved up to 0.35 μm.

In the case of a wafer that has been exposed in an imagewise manner with 10 mJ/cm$^2$ and thermally treated at 120° C. and that has a single-layer resist layer produced according to Example 7, structures with steep slopes can likewise be well resolved up to 0.35 μm.

EXAMPLE 12

Measuring the DUV photosensitivity and the contrast

A two layer resist layer produced according to Example 9 is contact-printed at 248 nm through a multidensity mask (firm Ditric Optics-Wilm. Div.). After the exposure, the wafer is placed on a 110° C.-hot hot plate for 1 min and subsequently developed for 90 s in the commercial developing agent NMD-W 2.38% (firm Tokyo Ohka). The developed wafer is then rinsed under running water and dried at 100° C. for 1 min on a hot plate. The contact-printed wafer shows a sensitivity of 1.7 mJ/cm$^2$ and a very high contrast of $-\gamma > 7$. The finest structures on the mask, 1 μm-lines and -spaces, are exactly resolved. No dark field loss is established when the resist layer had been previously dried (see Example 9) at 80° C. If it had been dried at 140° C., the dark field loss amounts to 40 nm.

A contact-printed wafer that has been thermally treated at 120° C. having a two-layer resist layer produced according to Example 8 exhibits a sensitivity of 1.1 mJ/cm$^2$ and a very high contrast of $-\gamma > 6$. The finest structures on the mask are exactly resolved in this case as well. No dark field loss is established when the resist layer had been previously dried (see Example 8) at 80° C. If it had been dried at 140° C., the dark field loss amounts to 35 nm.

EXAMPLE 13

DUV Photostructuring

A two-layer resist layer produced according to Example 9 (dried at 80° C.) is exposed in an imagewise manner on a KrF-excimer-laser projection printer (exposure wavelength: 248 nm; numerical aperture: 0.37; resolution: 0.35 μm) with a dose of 12 mJ/cm$^2$. After the exposure, the wafer is placed on a 110° C.-hot hot plate for 1 min and subsequently developed for 90 s in the commercial developing agent NMD-W 2.38% (firm Tokyo Ohka). The developed wafer is then rinsed under running water and dried at 100° C. for 1 min on a hot plate. Structures with steep slopes can be well resolved up to 0.25 μm.

In the case of a wafer that has been exposed in an imagewise manner with 8 mJ/cm$^2$ and thermally treated at 120° C. and that has a two-layer resist layer produced according to Example 8 (dried at 80° C.), structures with steep slopes can likewise be well resolved up to 0.25 μm.

EXAMPLE 14

Imaging of mask structures (in the bottom resist) true to size

A two-layer resist layer produced according to Example 9 is exposed in an imagewise manner—in accordance with Example 13—with a dose of 18 mJ/cm$^2$, thermally treated (110° C), developed and dried. Resist structures lines are obtained which are 0.1 μm narrower than the corresponding nominal structure dimensions on the mask. These structures are treated for 60 s with a silicon-containing agent consisting of 8 parts by weight of an aligomeric, linear dimethylsiloxane with terminal aminopropyl groups, 86 parts by weight of 1-methoxy-2-propanol and 6 parts by weight of water. They are then rinsed with isopropanol and dried. Resist structures are obtained thereby which are 0.03 μm wider than the corresponding nominal structure dimensions on the mask. If the wafer is subsequently etched in a plasma reactor with an oxygen plasma (gas pressure: 6 mtorr; bias voltage: 410 V), bottom-resist structures are obtained with the exact corresponding nominal structure dimensions on the mask and vertical slopes. When the resist layer had been previously dried (see Example 9) at 80° C., structures can be resolved true to size up to 0.45 μm; when it has been dried at 140° C., structures of up to 0.25 μm can be resolved true to size.

In the case of a wafer that has been exposed in an imagewise manner with 11 mJ/cm$^2$ and thermally treated at 120° C. and that has a two-layer resist layer produced according to Example 8—after a treatment with the silicon-containing agent for the duration of 40 s—structures of up to 0.45 μm or 0.25 μm can likewise be resolved true to size.

EXAMPLE 15

Producing narrow resist spaces

A two-layer resist layer produced according to Example 9 (dried at 140° C.) is exposed in an imagewise manner (dose: 12 mJ/cm$^2$)—according to Example 13—thermally treated (110° C.), developed and dried. The resist structures obtained show the exact corresponding nominal structure dimensions on the mask. These structures are treated for 120 s with the silicon-containing agent in accordance with Example 14; they are then rinsed with isopropanol and dried. Resist spaces are obtained which are 0.28 μm narrower than the corresponding nominal structure dimensions on the mask. If the wafer is subsequently etched in a plasma reactor with an oxygen plasma (gas pressure: 6 mtorr; bias voltage; 410 V), bottom-resist spaces with vertical slopes are obtained, which are narrower by 0.25 μm than the corresponding nominal structure dimensions on the mask. Thus, for example from a space with a nominal structure dimension on the mask of 0.35 μm, a bottom-resist space with a width of 0.1 μm is obtained; in other words, structures are obtained which are far below the resolution limit of the applied exposure technique.

In the case of a wafer that has been exposed in an imagewise manner with 8 mJ/cm$^2$ and thermally treated at 120° C. and that has a two-layer resist layer produced according to Example 8 (dried at 140° C.)—after a treatment with the silicon-containing agent for the duration of 100 s—corresponding structures are obtained.

EXAMPLE 16

Analogously to the manner described in Examples 14 and 15 for two-layer resist layers, one can proceed—with the application of an aromatic group-containing, that is silicon-free agent—in the case of single-layer resist layers. To this end, one proceeds in accordance with Example 11. A suitable aromatic group-containing agent, which—in the same way as the silicon-containing agent—exhibits amino groups, consists for example of 10 parts by weight of 1,3-diaminomethylbenzene, 86 parts by weight of 1-methoxy-2-propanol and 6 parts by weight of water. The single-layer resist layer can be produced, for example, in accordance with Example 8, that is with the application of ter(N-tertiary butyl-maleinimide/maleic anhydride/allyl trimethylsilane). In a corresponding way, however, ter(N-tertiary butoxycarbonyl-maleinimide/maleic anhydride/allyl trimethylsilane) can also be applied (see Example 3).

What is claimed is:

1. A process for producing structures in the submicron range comprising the steps of:
   a) depositing onto a substrate a photoresist layer comprising
      (1) a polymer constituent having
         functional groups, which are capable of reacting with primary or secondary amines, and
         N-blocked imide groups blocked with an acid-cleavable protective group,
      (2) a photoinitiator which release an acid when irradiated and
      (3) a suitable solvent;
   b) drying the photoresist layer;
   c) exposing the photoresist layer in an imagewise manner;
   d) subjecting the exposed photoresist layer to a heating treatment;
   e) developing the treated photoresist layer with an aqueous-alkaline or organic developing agent to create a photoresist structure including resist lines; and
   f) treating the photoresist structure with a chemical agent containing a primary or secondary amine, so as to expand the resist liens and to produce etching resistance, wherein, during developing, a defined dark field loss takes place in a range of between 20 and 100 nm.

2. The process according to claim 1, wherein a resist layer which is resistant to substrate etching processes is initially applied to the substrate and is baked out to become insoluble to resist solvents, and wherein the photoresist structure is etched in an anisotropic, oxygen-containing plasma after being treated with the chemical agent.

3. The process according to claim 2 wherein the polymer constituent has carboxylic acid anhydride groups as the functional groups.

4. The process according to claim 3 wherein maleic anhydride is the basis of the carboxylic acid anhydride groups.

5. The process according to claim 2 wherein the polymer constituent has imide groups blocked by a tertiary butoxycarbonyl residue.

6. The process according to claim 2 wherein the polymer constituent has imide groups blocked by a tertiary butyl residue.

7. The process according to claim 1 wherein the polymer constituent has carboxylic acid anhydride groups as the functional groups.

8. The process according to claim 7 wherein maleic anhydride is the basis of the carboxylic acid anhydride groups.

9. The process according to claim 7 wherein the polymer constituent is an N-tertiary butoxycarbonyl- or N-tertiary butyl-maleinimide/maleic anhydride copolymer.

10. The process according to claim 7 wherein the polymer constituent is a copolymer containing N-tertiary butoxycarbonyl- or N-tertiary butyl-maleinimide, maleic anhydride an styrol and/or allyl trimethylsilane.

11. The process according to claim 1 wherein the polymer constituent has imide groups blocked by a tertiary butoxycarbonyl residue.

12. The process according to claim 11 wherein the basis of the imide groups is maleinimide.

13. The process according to claim 1 wherein the polymer constituent has imide groups blocked by a tertiary butyl residue.

14. The process according to claim 13 wherein the basis of the imide groups is maleinimide.

* * * * *